United States Patent [19]

Sawabe et al.

[11] Patent Number: 5,110,405
[45] Date of Patent: May 5, 1992

[54] METHOD OF MANUFACTURING SINGLE-CRYSTAL DIAMOND PARTICLES

[75] Inventors: Atsuhito Sawabe; Tadao Inuzuka, both of Kawasaki, Japan

[73] Assignee: Kabushiki Kaisha Toshiba, Kawasaki, Japan

[21] Appl. No.: 363,788

[22] Filed: Jun. 9, 1989

[30] Foreign Application Priority Data

Jun. 9, 1988 [JP] Japan .................. 63-142052

[51] Int. Cl.$^5$ ............................. C30B 29/04
[52] U.S. Cl. .................. 156/610; 156/DIG. 68; 423/446; 427/39; 204/174
[58] Field of Search .............. 423/446; 427/39; 204/174; 601/86; 156/DIG. 68, 610

[56] References Cited

U.S. PATENT DOCUMENTS

| | | | |
|---|---|---|---|
| 3,030,188 | 4/1962 | Eversole | 423/446 |
| 3,630,678 | 12/1971 | Gardner | 156/DIG. 68 |
| 3,661,526 | 5/1972 | Angus et al. | 423/446 |
| 3,749,760 | 7/1973 | Deryagin et al. | 423/446 |
| 4,228,142 | 10/1980 | Holcombe et al. | 423/445 |
| 4,767,608 | 8/1988 | Matsumoto et al. | 156/DIG. 68 |
| 4,816,286 | 3/1989 | Hirose | 423/446 |
| 4,830,702 | 5/1989 | Singh et al. | 156/DIG. 68 |

FOREIGN PATENT DOCUMENTS

| | | | |
|---|---|---|---|
| 59-137311 | 8/1984 | Japan | 423/446 |
| 60-112699 | 6/1985 | Japan | 501/86 |
| 60-118694 | 6/1985 | Japan | 501/86 |
| 60-122794 | 7/1985 | Japan | 501/86 |
| 61-128700 | 6/1986 | Japan | 423/446 |
| 61-286299 | 12/1986 | Japan | 423/446 |
| 63-270394 | 11/1988 | Japan | 423/446 |

OTHER PUBLICATIONS

Applied Physics Letters, K. Suzuki, A. Sawave, D. Yasuda and T. Imuka, vol. 50 (1987), pp. 728-729.

*Primary Examiner*—Robert Kunemund
*Attorney, Agent, or Firm*—Oblon, Spivak, McClelland, Maier & Neustadt

[57] ABSTRACT

A method of manufacturing single-crystal diamond particles, according to the present invention, comprises the steps of introducing a reaction gas containing at least one organic compound into a reaction vessel having an anode and a cathode, producing a plasma by DC discharge caused between the anode and the cathode, and vibrating inorganic single-crystal particles in the plasma and depositing single-crystal diamond on the surface of the single-crystal particles. According to the method of the present invention, single-crystal diamond particles can be manufactured at high growth rate and with excellent reproducibility.

18 Claims, 3 Drawing Sheets

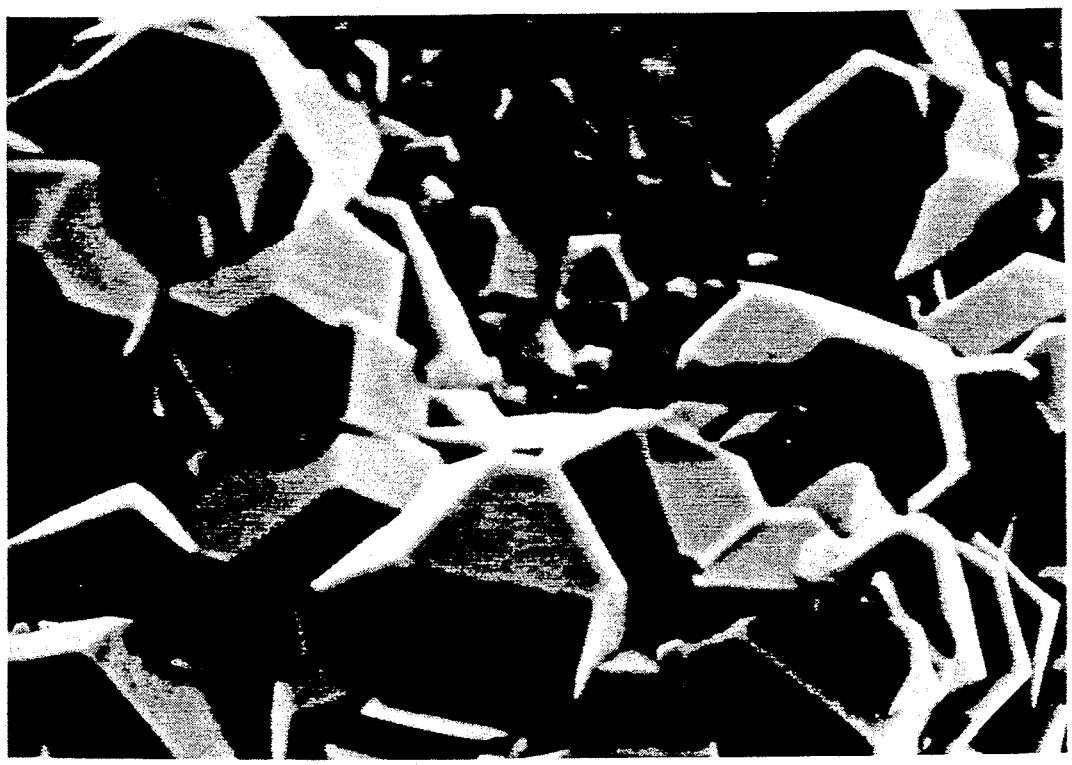
F I G. 3 ns of diamond thin films. However, the growth rate of diamond thin films according to these methods is low, i.e., 0.1 to 5 μm/hour. In order to increase the growth rate, it is necessary to scratch the surface of the substrate in advance by using high-hardness abrasive powder such as diamond or cubic boron nitride.

In order to solve the above problem, a diamond growth method by a plasma CVD using direct current discharge (DC plasma CVD) has been proposed (K. Suzuki, A. Sawabe, et al. Appl. Phys. Lett., 50,728 (1987)). According to this method, a diamond thin film can be made to grow on an as-polished (not scratched) surface of a substrate at a growth rate of 50–100 μm/hour. However, in this method, when diamond is deposited on an anode surface, discharge becomes unstable. If discharge stops, restart of the discharge is troublesome.

Any of the above conventional CVD methods has little problem in manufacturing diamond thin films. However, with these methods, it is difficult to grow diamond particles selectively on a substrate. Even if particles are used as growth nuclei, it is not possible to grow diamond over the entire surface of the particles.

Japanese Patent Disclosure (Kokai) No. 59-137311 discloses a method of manufacturing diamond particles. In this method, a gas mixture of hydrocarbon and hydrogen is introduced into a reaction vessel, and a plasma is produced by rf (radio-frequency) discharge or microwave discharge. In the plasma, diamond powder, or metal/non-metal inorganic powder used as growth nuclei is fluidized by sound wave or by mechanical means. As a result, diamond is deposited on the growth nuclei, so that polycrystalline diamond particles can be formed.

This method is suitable for manufacturing polycrystalline diamond particles, but is not suitable for producing single-crystal diamond particles. The growth rate, at which a single-crystal diamond particles are produced by this method, is very low, since the plasma is generated by rf discharge or microwave discharge, and the reproducibility of diamond particles in this case is not desirable.

SUMMARY OF THE INVENTION

The object of the present invention is to provide a method of manufacturing single-crystal diamond particles at a high growth rate and with excellent reproducibility.

The method of manufacturing single-crystal diamond particles according to the present invention comprises the steps of:

introducing a reaction gas including at least one organic compound into a reaction vessel having an anode and a cathode;

producing a plasma by direct current discharge caused between the anode and the cathode; and vibrating inorganic single-crystal particles in the plasma, and depositing single-crystal diamond on the surface of the single-crystal particles.

In the present invention, the term "single crystal" means not only a perfect single crystal, but also a pseudo-single crystal including twins, a pseudo-single crystal having secondary nuclei on the surface of the particles, and a pseudo-single crystal in which growth nuclei and deposited diamond have a relationship of orientation but a number of stacking faults or dislocations exist.

According to the method of the present invention, single-crystal diamond particles can be grown at a high growth rate and with excellent reproducibility. The grown diamond particles can be suitably applied to diamond polishing material or to the edges of various cutters in accordance with particle diameters, thus enhancing wear resistance of the polishing material or cutting efficiency of the cutters. Also, the method of the present invention can be applied to the technique of mending flaws in a diamond jewel. Thus, the range of uses of such manufactured diamond particles is much wider than that of uses of those manufactured by the conventional high-pressure synthesis. In addition, though there is no effective use of diamond scraps at present, the method of the present invention can add values to them for effective use.

BRIEF DESCRIPTION OF THE DRAWINGS

FIG. 3 is a scanning electron microscope (SEM) photograph showing a diamond thin film manufactured in Comparative Example 1.

DETAILED DESCRIPTION OF THE PREFERRED EMBODIMENT

A structure of a reaction apparatus used in the present invention will now be described. A substrate holder on which inorganic single-crystal particles are placed is arranged within a reaction vessel. The substrate holder itself is used as an anode, or an electrode serving as an anode is provided near the holder. A cathode is arranged within the reaction vessel so as to face the holder.

In the present invention, it is desirable that the upper surface of the holder is entirely covered by a plasma during DC discharge. Thus, in the case where the electrode serving as the anode is provided near the holder, it is desirable that the electrode be formed in an annular shape so as to surround the holder. Also, in the case where the electrode serving as the anode is provided near the holder, it is desirable that the potential of the holder be made equal to that of the anode or be set to a floating potential value. The holder, anode, and cathode are heated up to 800 to 1,100° C. during DC discharge by bombardment of ions, electrons, and neutral gas particles having energy. Thus, it is desirable that these members be made of a refractory metal such as molybdenum.

On the other hand, it is desirable that a filament for starting DC discharge and/or for maintaining the discharge be provided near the cathode. The filament may be made of a material which can easily emit thermoelectrons. It is desirable, however, that, when such a material reacts with a reaction gas containing an organic compound, a carbide be produced on the surface of the material so that the material is rendered chemically stable. Such a material is, for example, tungsten.

In the present invention, for example, a natural diamond, a diamond produced by high-pressure synthesis, silicon carbide, or hexagonal boron nitride may be used as the material of the inorganic single-crystal particle placed on the substrate holder.

Figure 1:
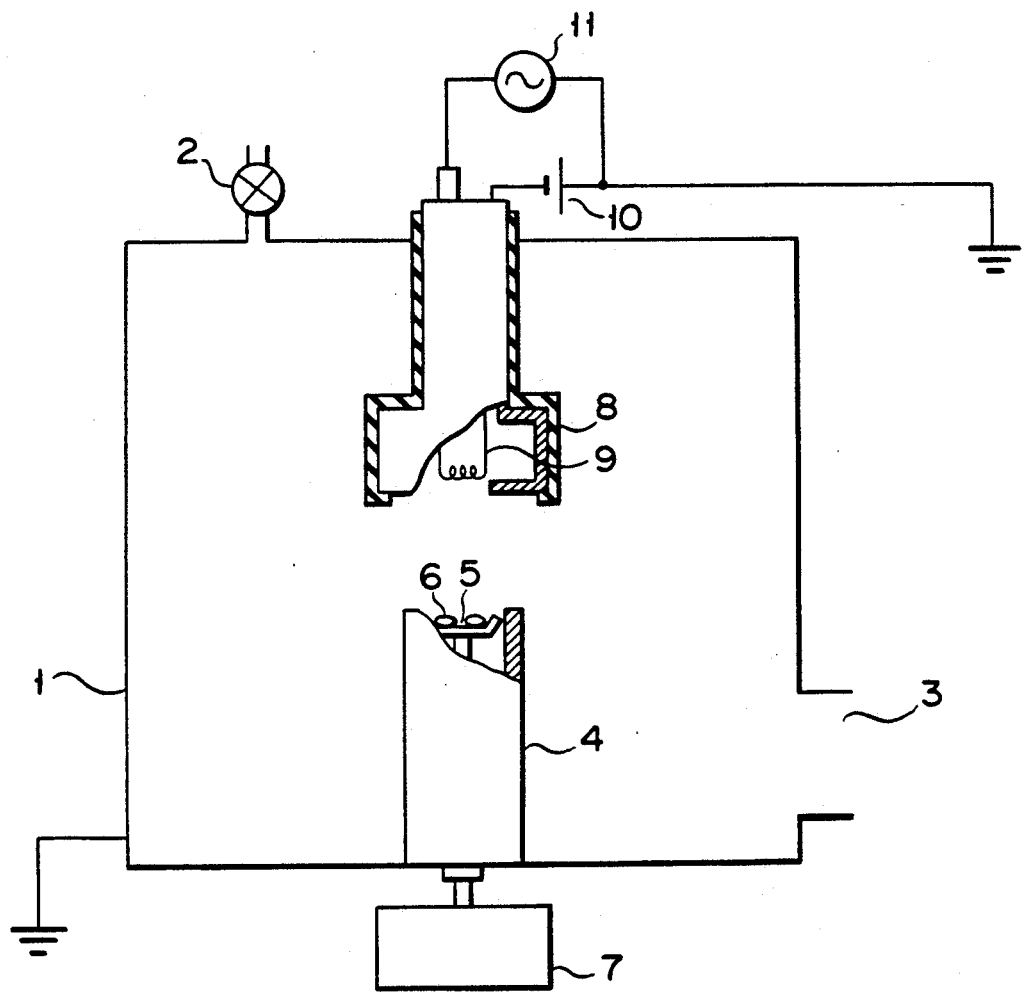
FIG. 1 is a cross section of a reaction apparatus used in the present invention.

FIG. 1 shows an example of a reaction apparatus used in the present invention. A reaction vessel 1 has a reaction gas inlet 2 and a vacuum outlet 3. A molybdenum annular anode 4, which is earthed, is arranged in a lower part of the reaction vessel 1. A molybdenum circular saucer-like substrate holder 5 is placed within the annular anode 4. The substrate holder 5 is set in a floating potential. Inorganic single-crystal particles 6 are placed on the holder 5. A bottom portion of the holder 5 is coupled to a vibrator 7. A molybdenum cathode 8 is arranged in an upper part of the reaction vessel 1 so as to face the holder 5. A tungsten filament 9 is placed within the cathode 8. The cathode 8 is shielded from the reaction vessel 1, and is connected to a DC power source 10 for supplying high voltage. The filament 9 is connected to an AC power source 11 for heating the filament.

In the reaction apparatus having the structure shown in FIG. 1, a negative potential is applied to the cathode 8. However, even if the cathode 8 is earthed and a positive potential is applied to the anode 4 or holder 5, the principle of operation of the apparatus is identical.

In this invention, a reaction gas containing at least one organic compound is introduced into the reaction vessel having the above structure. DC discharge is caused between the anode and the cathode. While the inorganic single-crystal particles on the holder are being vibrated, single-crystal diamond is deposited on the surface of the inorganic single-crystal particles.

In the present invention, any gas containing at least one organic compound, which can generate carbon used as material of a diamond, can be used as the reaction gas. For example, the organic compound may be a hydrocarbon such as methane, ethane, propane, ethylene or acetylene, or acetone, methanol, ethanol, butanol, acetaldehyde, carbon monoxide, or carbon dioxide. When diamond particles are manufactured by the method of the present invention, it is desirable that the reaction gas include a given amount of hydrogen. The amount of hydrogen to be included in the reaction gas is not specified, since various reaction conditions must be considered. It is desirable, however, that the volume ratio of the organic compound to the hydrogen be 0.001 to 1.0. In addition, the reaction gas may include oxygen and/or water in order to control the characteristic of diamond. It is desirable that the pressure of the reaction gas be 1 to 1,000 Torr, and preferably 50 to 300 Torr for production of a single crystal. The flow rate of the reaction gas is determined by the volume of the reaction vessel. The flow rate is determined so that the gas consumed by the reaction may be sufficiently replenished.

In the present invention, it is important that a plasma is caused by DC discharge, an organic compound is decomposed in the plasma, and individually separated carbons are produced in the reaction vessel. In this case, an arc discharge side region such as an abnormal glow discharge region or a glow-arc transition region, rather than a normal glow discharge region, is necessary. Typical characteristics of the DC discharge are (1) substantially equal potential gradient between the anode and cathode (there is no remarkable positive potential drop or negative potential drop), and (2) current density of about 0.1 to 10 A/cm$^2$. The value of the DC voltage to be applied is equal to or higher than that of the voltage applied during normal glow discharge, under the condition that the distance between the anode and cathode and the reaction pressure are constant.

In the present invention, the temperature of the single-crystal particles during the reaction is in a range of 800 to 1,100° C. and preferably in a range of 850 to 900° C., though the temperature varies depending on the supplied electric power.

Generally, the substrate holder is coupled to a vibrator in order to vibrate the single-crystal particles on the holder. The direction of vibration may be vertical of horizontal. The amplitude and cycle of vibration depend on types of vibrators. It is desirable that the vibrator be supplied with a sawtooth voltage to vibrate the holder.

According to the method of the present invention, while the inorganic single-crystal particles are vibrated, a reaction is caused in the plasma produced by DC discharge, and single-crystal diamond is deposited on the entire surface of the inorganic single-crystal particles or the growth nuclei at high growth rate and with excellent reproducibility (bonding between diamond particles does not occur). In contrast, with rf discharge or microwave discharge, it is difficult to grow single-crystal diamond particles at high growth rate and with excellent reproducibility.

EXAMPLE 1

Single-crystal diamond particles were manufactured by using the reaction apparatus shown in FIG. 1 in the following manner. Single-crystal diamond particles (diamond scraps) 6 (particle diameter: about 5 μm) were placed on the substrate holder 5. The reaction vessel 1 was evacuated of air, and the pressure within the reaction vessel 1 was reduced to $10^{-7}$ Torr. A gas mixture of methane and hydrogen (volume ratio: 1:100) was introduced into the reaction vessel 1, and the pressure within the reaction vessel 1 was raised to 200 Torr which is necessary for reaction. An electric current was supplied to the filament 9 placed in the cathode 8, and the temperature of the filament 9 was raised to 2,000° C. Then, a voltage was applied to the cathode 8 to start DC discharge. The temperature of the anode 4 and holder 5 was raised to about 1,000° C., under the condition that the distance between the anode and cathode was 1.5 cm, discharge voltage was 800 V and discharge current was 500 mA. After the start of DC discharge, the vibrator 7 was operated to vibrate the holder 5. The direction of vibration was vertical, the amplitude of vibration was 1 cm, and vibration cycle was 60/min. During the reaction, the reaction gas was supplied at a flow rate of 400 sccm. During the reaction, a positive column was observed just above the anode 4 and the holder 5.

Figure 2:
FIG. 2 is a scanning electron microscope (SEM) photograph showing a diamond particle manufactured in Example 1.

FIG. 2 is an SEM (scanning electron microscope) photograph showing a diamond particle obtained after two-hour reaction. As shown in FIG. 2, the initial diamond scrap having a diameter of about 5 μm grew to the diamond particle having the diameter of about 20 μm. The obtained particle was subjected to X-ray diffraction, Raman spectroscopy and secondary ion mass spectrometry, and it was confirmed that the particle was a single-crystal diamond including substantially no impurities.

COMPARATIVE EXAMPLE 1

A diamond scrap having a diameter of about 5 μm was used as in Example 1, and diamond was caused to deposit under the same conditions as in Example 1, excepting that the substrate holder 5 was not vibrated.

After one-hour reaction, the surface of the holder 5 was observed by an optical microscope, and it was confirmed that diamond was grown. However, diamond was deposited in the form of a thin film, and bonded to diamond particles placed on the surface of the molybdenum holder 5. Thus, individually separated diamond particles were not observed. FIG. 3 is an SEM photograph showing the diamond thin film formed after the one-hour reaction. FIG. 3 shows two kinds of particles having remarkably different diameters. The particles having greater diameters were formed from the singlecrystal diamond particles used as growth nuclei. The particles having smaller diameters were deposited on the molybdenum holder from gas-phase. It was clarified that individually separated diamond particles were not formed when the substrate holder was not vibrated.

The present invention is not limited to the above example. Various modifications and changes can be made to the invention, within the scope of the subject matter and the spirit of the present invention.

What is claimed is:

1. A method of manufacturing single-crystal diamond particles, comprising the steps of:

introducing a reaction gas containing at least one organic compound into a reaction vessel having an anode and a cathode;

producing a plasma by direct current discharge caused between the anode and the cathode; and vibrating inorganic single-crystal particles in the plasma, and depositing single-crystal diamond on the surface of the single-crystal particles, the substantially single-crystal diamond comprising at least one of a pseudosingle crystal including twins, a pseudo-single crystal having secondary nuclei on a surface of a particle thereof, and a pseudo-single crystal in which a growth nuclei and deposited diamond have a relationship of orientation and a number of stacking faults;

wherein said cathode is provided with a filament for starting discharge, and/or for maintaining the discharge; and wherein discharge from an abnormal glow discharge region to a glow-arc transition region is caused between said anode and said cathode.

2. The method according to claim 1, wherein said reaction gas includes hydrogen and at least one organic compound selected from the group of hydrocarbon, alcohol, ketone, aldehyde, carbon monoxide and carbon dioxide.

3. The method according to claim 2, wherein, in said reaction gas, the ratio of the organic compound to the hydrogen is in a range of 0.001 to 1.0.

4. The method according to claim 2, wherein the pressure of said reaction gas is in a range of 1 to 1,000 Torr.

5. The method according to claim 4, wherein the pressure of said reaction gas is in a range of 30 to 500 Torr.

6. The method according to claim 1, wherein said inorganic single-crystal particles is made of diamond, silicon carbide, or hexagonal boron nitride.

7. The method according to claim 1, wherein said inorganic single-crystal particles are placed on a substrate holder which is coupled to a vibrator, and the inorganic single-crystal particles are vibrated by actuating the vibrator.

8. The method according to claim 7, wherein said vibrator be supplied with a sawtooth voltage to vibrate the substrate holder.

9. The method according to claim 7, wherein said substrate holder, on which said inorganic single-crystal particles are placed, is used as said anode.

10. The method according to claim 7, wherein an annular electrode surrounding said substrate holder, on which said inorganic single-crystal particles are placed, is used as said anode.

11. The method according to claim 10, wherein the potential of said substrate holder is equal to that of the anode, or set to a floating potential value.

12. The method according to claim 11, wherein said substrate holder and said annular electrode are made of a refractory metal.

13. The method according to claim 12, wherein said substrate holder and said annular electrode are made of molybdenum.

14. The method according to claim 1, wherein said filament is made of a material, on the surface of which a carbide is produced to make the material chemically stable.

15. The method according to claim 14, wherein said filament is made of tungsten.

16. The method according to claim 1, wherein said discharge is caused under the condition that the potential gradient between the anode and cathode is substantially constant and the current density of the discharge is 0.1 to 10 A/cm$^2$.

17. The method according to claim 1, wherein the temperature of said inorganic single-crystal particles during the reaction is in a range of 800 to 1,100° C.

18. The method according to claim 17, wherein the temperature of said inorganic single-crystal particles during the reaction is in a range of 850 to 900° C.

* * * * *